United States Patent [19]

Bearinger et al.

[11] Patent Number: 5,399,441
[45] Date of Patent: Mar. 21, 1995

[54] METHOD OF APPLYING OPAQUE COATINGS

[75] Inventors: Clayton R. Bearinger; Robert C. Camilletti; Loren A. Haluska; Keith W. Michael, all of Midland, Mich.

[73] Assignee: Dow Corning Corporation, Midland, Mich.

[21] Appl. No.: 226,585

[22] Filed: Apr. 12, 1994

[51] Int. Cl.⁶ .......................... B32B 9/00; B32B 19/00
[52] U.S. Cl. .................................... 428/689; 427/96; 427/228; 427/372; 427/387; 427/397.7; 427/235; 427/238; 428/702
[58] Field of Search ............... 427/96, 226, 228, 377, 427/387, 397.7; 437/235, 238; 428/689, 702

[56] References Cited

U.S. PATENT DOCUMENTS

| 4,746,693 | 5/1988 | Meder ................... 524/306 |
| 4,749,631 | 6/1988 | Haluska et al. ........ 428/704 |
| 4,756,977 | 7/1988 | Haluska et al. ........ 428/704 |
| 5,258,334 | 11/1993 | Lantz .................... 437/238 |

*Primary Examiner*—Michael Lusignan
*Attorney, Agent, or Firm*—Roger E. Gobrogge

[57] ABSTRACT

Disclosed is a method of forming opaque coatings on integrated circuits. The method comprises selectively applying a coating of a silica precursor resin and a filler onto the integrated circuit and heating the coated circuit at a temperature sufficient to convert the silica precursor resin to a silica containing ceramic matrix.

16 Claims, No Drawings

METHOD OF APPLYING OPAQUE COATINGS

BACKGROUND OF THE INVENTION

The present invention relates to a method of applying opaque coatings on electronic devices. Essentially, the process comprises selectively depositing compositions comprising silica precursor resins and opaque fillers. The resultant coatings provide both an environmental barrier for the device and a mechanism which inhibits inspection and reverse engineering of the device.

The use of silica-containing ceramic coatings on substrates such as electronic devices is known in the art. For instance, Haluska et al. in U.S. Pat. Nos. 4,749,631 and 4,756,977 disclose processes for forming silica coatings on electronic substrates wherein solutions of silica precursor resins are applied to substrates followed by heating the coated substrates in air at a temperature in the range of 200°–1000° C. These references, however, do not describe the use of fillers within the coating nor the selective deposition process claimed herein.

Similarly, the use of opaque fillers within ceramic coatings for electronic devices is also known in the art. For instance, U.S. Pat. No. 5,258,334 describes a composition comprising a silica precursor resin and a filler which is used to coat the surface of an electronic device. It is taught therein that the silica precursor is applied or flows over the surface of the device to deny visual access. Since the resultant coating is opaque, however, it is difficult to etch at the bond pads and streets for interconnection and dicing.

The object of the present invention is to develop an efficient method for depositing opaque coatings on electronic devices. The present inventors have now discovered such a process in which ceramic coatings derived from compositions comprising silica precursor resins and fillers are selectively applied to the surface of the device.

SUMMARY OF THE INVENTION

The present invention relates to a method of forming a radiopaque coating on an integrated circuit and the integrated circuit coated thereby. The method comprises first selectively applying a composition comprising a silica precursor resin and a filler comprising an insoluble salt of a heavy metal onto the surface of an integrated circuit in a manner which prevents covering its bond pads or the streets. The coated integrated circuit is then heated at a temperature sufficient to convert the composition to a radiopaque ceramic coating.

The present invention also relates to a method of forming an optically opaque coating on an integrated circuit and the integrated circuit coated thereby. The method comprises first selectively applying a composition comprising a silica precursor resin and an optically opaque filler onto the surface of the integrated circuit in a manner which prevents covering its bond pads or the streets. The coated integrated circuit is then heated at a temperature sufficient to convert the composition to an optically opaque ceramic coating.

DETAILED DESCRIPTION OF THE INVENTION

The present invention is based on the discovery that opaque coatings can be selectively formed on integrated circuits from compositions comprising silica precursor resins and fillers. Radiopaque coatings can be formed from fillers comprising insoluble salts of heavy metals and optically opaque coatings can be formed from optically opaque fillers. These coatings inhibit examination and/or reverse engineering of the underlying substrate (e.g., circuit layout) and inhibit the degradative effects of radiation. The coatings also provide an environmental barrier on the substrates.

The Applicants herein have also discovered that the coating compositions of the invention do not flow after applied to the surface of the circuit. As such, they can be selectively deposited on specific areas of the circuit (i.e., those areas in which inspection needs to be inhibited). This process is advantageous since etching an opaque coating can be very difficult (e.g., for interconnecting or dicing the circuit).

As used in the present invention, the expression "silica containing matrix" is used to describe the hard coating obtained after heating the silica precursor resin. This coating contains both amorphous silica ($SiO_2$) materials as well as amorphous silica-like materials that are not fully free of residual carbon (e.g., Si—C or Si—OC), silanol (Si—OH) and/or hydrogen (which are obtained upon heating the silica precursor resin) and the filler materials. The expression "filler" is used to describe a finely divided solid phase which is distributed within the resin and the final ceramic coating. The expression "integrated circuit" is meant to include silicon based devices, gallium arsenide based devices, focal plane arrays, opto-electronic devices, photovoltaic cells and optical devices. The expression "optically opaque" is used to describe materials which inhibit transmission of at least about 90% of visual light (i.e., they are not transparent by visual inspection of the human eye under normal lighting). The expression "radiopaque" is used to describe materials which inhibit transmission of at least about 90% of a specific type of radiation such as microwave, x-ray, UV, and IR or sound waves.

In the process of the present invention an opaque ceramic coating is formed on the integrated circuit by a process which comprises selectively applying a coating composition comprising a silica precursor resin and a filler onto the surface of the integrated circuit and then heating the coated circuit at a temperature sufficient to convert the composition to a silica-containing ceramic matrix having the filler distributed therein.

The silica precursor resins which may be used in the invention include, but are not limited to, hydrogen silsesquioxane resin (H-resin), hydrolyzed or partially hydrolyzed $R_nSi(OR)_{4-n}$, or combinations of the above, in which R is an aliphatic, alicyclic or aromatic substituent of 1–20 carbon atoms such as an alkyl (e.g. methyl, ethyl, propyl), alkenyl (e.g. vinyl or allyl), alkynyl (e.g. ethynyl), cyclopentyl, cyclohexyl, phenyl etc., and n is 0–3.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (e.g., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The second type of silica precursor resin useful herein includes hydrolyzed or partially hydrolyzed compounds of the formula $R_nSi(OR)_{4-n}$, in which R and n are as defined above. Some of these materials are commercially available, for example, under the tradename ACCUGLASS. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si—O—Si resins. Compounds in which x=2 are generally not used alone as volatile cyclic structures are generated during pyrolysis, but small amounts of said compounds may be cohydrolyzed with other silanes to prepare useful preceramic materials.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When a silica precursor resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The fillers used herein are known in the art for use in coatings with other polymers. These included various inorganic and organic fillers, especially inorganic fillers, in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, barium sulfate, pigments and diamond. Additionally, the opaque fillers can be metals which react in an oxidizing environment to liberate enough heat to damage and/or destroy the underlying substrate. When these fillers are oxidized by, for example, plasma etching, wet etching, or cross-sectioning, they liberate heat which causes destruction of the underlying substrate and, thus, inhibits further examination. These metals include, for example, magnesium, iron, silicon, tin and zinc.

The preferred radiopaque fillers to be used herein are the insoluble salts of heavy metals since these salts render the resultant coating opaque to radiation such as x-rays, UV, IR and visible light as well as sound waves. These include, for example, the insoluble salts of barium, lead, silver, gold, cadmium, antimony, tin, palladium, strontium, tungsten and bismuth. Such salts can include, for example, carbonates, sulfates and oxides. Particularly preferred is the use of barium sulfate.

The preferred optically opaque fillers which may be used herein are any which, when dispersed in the silica containing matrix, render the coating impenetrable to visual light. Preferred are the oxides, nitrides and carbides of silicon and alumina, metals as well as inorganic pigments. Particularly preferred are plasma alumina microballoons (eg., average size of about 6 microns), silica microballoons (e.g., average size of about 5–40 microns), silicon nitride powder, silicon carbide powder, aluminum nitride powder and inorganic pigments (eg., black Ferro ® F6331—average size of about 0.4 microns).

The particle size and shape of the above fillers can vary over a wide range depending on factors such as the type of filler, the desired coating thickness, etc.

The amount of filler used in the present invention can also be varied over a wide range depending, for example, on the quality and electrical characteristics desired in the final coating. Generally, however, the fillers are used in an amount less than about 90 weight percent (or 90 vol. %) of the coating to insure that enough resin is present to bind the filler. Obviously, smaller amounts of fillers (e.g., 1–5 wt %) can also be used. A preferred amount of filler is in the range of about 5 to about 80 wt. percent of the coating.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents such as cellulose, clay, fumed silica, stearates and the like in the coating composition. Additionally, it is within the scope of the invention to include agents such as diamond which inhibit mechanical abrasion. These and other optional components are known to those skilled in the art.

According to the process of the invention, the silica precursor resin, filler and any optional components are selectively applied to the surface of an integrated circuit. The surface of the integrated circuit can be bare (i.e., no passivation) or the circuit can have a passivation. Such passivation can be, for example, ceramic coatings such as silica, silicon nitride, silicon carbide, silicon oxynitride, silicon oxycarbide, etc. deposited by, for example, CVD, PVD, or sol-gel approaches. Such passivation is known to those skilled in the art. Likewise, the circuit can be pre or post interconnection.

The coating according to the present invention can be applied in any manner, but a preferred method involves dissolving the silica precursor resin in a solvent and dispersing the filler and any optional components therein. This dispersion is then selectively applied to the surface of the circuit. Various facilitating measures such as stirring, ultrasonic, ball milling and/or heating may be used to dissolve or disperse the silica precursor resin and filler and create a more uniform application material. Solvents which may be used include any agent or mixture of agents which will dissolve or disperse the silica precursor resin and filler to form a liquid mixture without affecting the resultant coating. These solvents can include, for example, alcohols such as ethyl or isopropyl, aromatic hydrocarbons such as benzene or toluene, aliphatic hydrocarbons such as n-heptane or dodecane, ketones, esters, ethers, or linear or cyclic polysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the silica precursor resin, filler, solvent, and, any optional components is then selectively coated onto the circuit. The method of selective coating is not critical. The important aspect, however, is that the liquid mixture be applied in a manner which eliminates the need for a subsequent etching step, e.g., at the bond pads needed for interconnection and at the streets. Examples of methods include approaches such as (1) masking the circuit, applying the mixture and removing the mask, (2) selectively "painting" the circuit and (3) silk screening. Other equivalent means, however, are also deemed to be within the scope of this invention.

The solvent is then allowed to evaporate from the coated circuit resulting in the deposition of the silica precursor resin and filler coating. Any suitable means of evaporation may be used such as simple air drying by exposure to an ambient environment, by the application of a vacuum or mild heat (e.g., less than 50° C.) or during the early stages of the heat treatment.

Although the above described methods primarily focus on using a liquid approach, one skilled in the art would recognize that other equivalent means (e.g., melting the resin, dispersing the filler therein and coating the circuit with the dispersion) would also function herein and are contemplated to be within the scope of this invention.

The silica precursor resin and filler coating is then typically converted to a silica-containing ceramic matrix having the filler disbursed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°–425° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods an opaque ceramic coating is produced on the substrate. The thickness of the coating can vary over a wide range (e.g., up to 500 microns) as described above. These coatings smooth the irregular surfaces of various substrates, they are relatively defect free, and they have excellent adhesive properties. In addition, the coatings are opaque to radiation such as x-rays, UV, IR and visible light, as well as sound waves.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No.4,756,977, which is incorporated herein by reference. An especially preferred coating is silicon carbide applied by the chemical vapor deposition of an organosilicon precursor. One example of such a process is described in U.S. Pat. No.

5,011,706 which is incorporated herein by reference. A second example involves the chemical vapor deposition utilizing trimethylsilane as the source gas. The most preferred coating comprises silicon carbide deposited in a non-uniform thickness such that uniform etching is difficult.

The following non-limiting example is provided so that one skilled in the art may more fully understand the invention.

EXAMPLE 1

A coating composition was formed by mixing 12 g plasma alumina, average particle size=6 micrometers (Product No. 13,699, ZYP Coatings, Inc.), 4 g of Hydrogen silsesquioxane resin made by the method of Collins et al. in U.S. Pat. No. 3,615,273, 0.6 g glycidoxypropyltrimethoxysilane, 0.4 g Pt catalyst (Pt(AcAc)$_2$ in toluene which provided 120 ppm Pt) and 20 g cyclic polydimethylsiloxane. A sonic probe was used for 60 seconds for dispersion.

Four—2.5 cm×7.5 cm aluminum panels and 2—2.5 cm×7.5 cm silicon panels were used in the experiment. A line was scribed across the width of the substrates at approximately the center of the length (i.e., at about 3.75 cm from each end). The scribed line was then cross scribed at the top, middle and bottom. An approximately 2 millimeter wide mask was centered over the scribed lines on the panels and the above coating composition then sprayed on each of the six panels using a Binks ® HVLP spray gun and N$_2$ propellant.

The masks were removed from the panels. The distance from the edge of the coating to the scribed line was then measured at the top, middle and bottom cross scribe. The data is recorded in Table 1.

The panels were then heated in a Lindberg furnace at 400° C. for 1 hour in air. The distance from the edge of the resultant ceramic coating to the scribed line was again measured at the top, middle and bottom cross scribe. The data is recorded in Table 1. As is readily apparent from this data, the coating does not flow during the processing. This proves, therefore, that the ceramic coating can be selectively applied to the desired areas of an integrated circuit.

TABLE 1

| Substrate | Coating Thickness | Distance Before Heating | Distance After Heating |
|---|---|---|---|
| Al - 1 | — | | |
| Top | | 1600 | 1600 |
| Bottom | | 1580 | 1580 |
| Middle | | 1620 | 1620 |
| Al - 2 | 86 | | |
| Top | | 1520 | 1520 |
| Bottom | | 1600 | 1600 |
| Middle | | 1780 | 1780 |
| Al - 3 | 110 | | |
| Top | | 2360 | 2360 |
| Bottom | | 2400 | 2400 |
| Middle | | 2480 | 2480 |
| Al - 4 | 28 | | |
| Top | | 2160 | 2160 |
| Bottom | | 2160 | 2160 |
| Middle | | 2260 | 2260 |
| Si - 1 | 89 | | |
| Top | | 1720 | 1720 |
| Bottom | | 1880 | 1880 |
| Middle | | 1980 | 1980 |
| Si - 2 | — | | |
| Top | | 1660 | 1660 |
| Bottom | | 1680 | 1680 |

TABLE 1-continued

| Substrate | Coating Thickness | Distance Before Heating | Distance After Heating |
|---|---|---|---|
| Middle | | 1660 | 1660 |

Distance and thickness measured in micrometers

What is claimed is:

1. A method of forming a radiopaque coating on an integrated circuit comprising:
    applying a coating composition comprising a silica precursor resin and a filler comprising an insoluble salt of a heavy metal onto the surface of an integrated circuit, wherein the coating composition is selectively applied such that the bond pads to be used for interconnection and the streets are not coated; and
    heating the coated integrated circuit to a temperature sufficient to convert the coating composition into a ceramic coating.

2. The method of claim 1 wherein the silica precursor resin is selected from the group consisting of hydrogen silsesquioxane resin and hydrolyzed or partially hydrolyzed R$_n$Si(OR)$_{4-n}$, wherein R is an aliphatic, alicyclic or aromatic substituent of 1–20 carbon atoms and n is 0–3.

3. The method of claim 1 wherein the coated integrated circuit is heated to a temperature in the range of between about 50° C. and about 800° C. for less than about 3 hours in an environment selected from the group consisting of air, O$_2$, oxygen plasma, an inert gas, ammonia, amines, moisture, and N$_2$O.

4. The method of claim 1 wherein the coating composition also contains a material selected from the group consisting of filler surface modifiers, abrasion resistant agents and suspending agents.

5. The method of claim 1 wherein the filler is in a form selected from the group consisting of powders, particles and flakes.

6. The method of claim 1 wherein the filler is selected from the group consisting of the carbonates, sulfates and oxides of barium, lead, silver, gold, cadmium, antimony, tin, palladium, strontium, tungsten and bismuth.

7. The method of claim 1 wherein the filler is present in the coating composition in an amount in the range of about 5 to about 80 weight percent.

8. The integrated circuit coated by the method of claim 1.

9. A method of forming an optically opaque coating on an integrated circuit comprising:
    applying a coating composition comprising a silica precursor resin and an optically opaque filler onto an integrated circuit, wherein the coating composition is selectively applied such that the bond pads to be used for interconnection and the streets are not coated; and
    heating the coated electronic substrate at a temperature sufficient to convert the coating composition into a ceramic coating.

10. The method of claim 9 wherein the silica precursor resin is selected from the group consisting of hydrogen silsesquioxane resin and hydrolyzed or partially hydrolyzed R$_n$Si(OR)$_{4-n}$, wherein R is an aliphatic, alicyclic or aromatic substituent of 1–20 carbon atoms and n is 0–3.

11. The method of claim 9 wherein the coated integrated circuit is heated at a temperature in the range of between about 50° C. and about 800° C. for less than about 3 hours in an environment selected from the group consisting of air, $O_2$, oxygen plasma, an inert gas, ammonia, amines, moisture, and $N_2O$.

12. The method of claim 9 wherein the coating composition also contains a material selected from the group consisting of filler surface modifiers, suspending agents and abrasion resistant agents.

13. The method of claim 9 wherein the filler is in a form selected from the group consisting of powders, particles, flakes and microballoons.

14. The method of claim 9 wherein the filler is selected from the group consisting of oxides, nitrides, and carbides of silicon or alumina, metals and inorganic pigments.

15. The method of claim 9 wherein the filler is present in the coating composition in an amount in the range of about 5 to about 80 weight percent.

16. The integrated circuit coated by the method of claim 9.

* * * * *